(12) United States Patent
Varadarajan et al.

(10) Patent No.: US 11,087,857 B2
(45) Date of Patent: Aug. 10, 2021

(54) ENABLING HIGH AT-SPEED TEST COVERAGE OF FUNCTIONAL MEMORY INTERFACE LOGIC BY SELECTIVE USAGE OF TEST PATHS

(71) Applicant: Texas Instruments Incorporated, Dallas, TX (US)

(72) Inventors: Devanathan Varadarajan, Allen, TX (US); Lei Wu, Sugar Land, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 13 days.

(21) Appl. No.: 16/192,796

(22) Filed: Nov. 15, 2018

(65) Prior Publication Data

US 2019/0156908 A1    May 23, 2019

Related U.S. Application Data

(60) Provisional application No. 62/586,614, filed on Nov. 15, 2017.

(51) Int. Cl.

| | |
|---|---|
| *G11C 29/16* | (2006.01) |
| *G11C 29/10* | (2006.01) |
| *G01R 31/3185* | (2006.01) |
| *G11C 29/32* | (2006.01) |
| *G11C 29/12* | (2006.01) |
| *G11C 29/26* | (2006.01) |
| *G11C 29/02* | (2006.01) |
| *G11C 29/14* | (2006.01) |
| *G11C 29/36* | (2006.01) |

(52) U.S. Cl.
CPC ...... *G11C 29/16* (2013.01); *G01R 31/318594* (2013.01); *G01R 31/318597* (2013.01); *G11C 29/022* (2013.01); *G11C 29/023* (2013.01); *G11C 29/10* (2013.01); *G11C 29/1201* (2013.01); *G11C 29/12015* (2013.01); *G11C 29/14* (2013.01); *G11C 29/26* (2013.01); *G11C 29/32* (2013.01); *G11C 29/36* (2013.01)

(58) Field of Classification Search
CPC .......................... G11C 29/16; G01R 1/318597
See application file for complete search history.

(56) References Cited

U.S. PATENT DOCUMENTS

| | | | | |
|---|---|---|---|---|
| 4,841,233 A * | 6/1989 | Yoshida | ................ | G11C 29/46 365/201 |
| 5,675,545 A * | 10/1997 | Madhavan | ............ | G11C 29/12 365/201 |
| 6,754,117 B2 * | 6/2004 | Jeddeloh | ................ | G11C 29/44 365/200 |
| 7,444,560 B2 * | 10/2008 | Nguyen | ........... | G01R 31/31721 365/201 |

(Continued)

*Primary Examiner* — Steve N Nguyen
(74) *Attorney, Agent, or Firm* — Charles F. Koch; Charles A. Brill; Frank D. Cimino

(57) ABSTRACT

A device to test functional memory interface logic of a core under test is described herein. The device includes and utilizes a built in self test controller to generate test sequences, and a clock-gating circuit to selectively supply the test sequences to a memory input or memory output on the core under test. After an initial data initialization of the core under test at built in self test mode, an at-speed functional mode is utilized to capture a desired memory output.

9 Claims, 4 Drawing Sheets

(56) References Cited

U.S. PATENT DOCUMENTS

| | | | | |
|---|---|---|---|---|
| 7,631,238 | B2* | 12/2009 | Jung | G11C 5/02 |
| | | | | 714/738 |
| 8,671,320 | B2* | 3/2014 | Tekumalla | G01R 31/318594 |
| | | | | 714/731 |
| 9,588,177 | B1* | 3/2017 | Atwood | G01R 31/31707 |
| 2003/0084390 | A1* | 5/2003 | Tamarapalli | G06F 11/267 |
| | | | | 714/744 |
| 2004/0006729 | A1* | 1/2004 | Pendurkar | G01R 31/318561 |
| | | | | 714/733 |
| 2005/0120284 | A1* | 6/2005 | Ouellette | G11C 29/1201 |
| | | | | 714/718 |
| 2009/0003424 | A1* | 1/2009 | Waayers | G01R 31/31858 |
| | | | | 375/226 |
| 2009/0217112 | A1* | 8/2009 | Eckelman | G11C 29/56012 |
| | | | | 714/723 |
| 2014/0101500 | A1* | 4/2014 | Bastimane | G01R 31/318555 |
| | | | | 714/727 |
| 2016/0219168 | A1* | 7/2016 | Shimada | H04N 1/00411 |

* cited by examiner

ENABLING HIGH AT-SPEED TEST COVERAGE OF FUNCTIONAL MEMORY INTERFACE LOGIC BY SELECTIVE USAGE OF TEST PATHS

RELATED APPLICATIONS

This application claims the benefit of U.S. Provisional Patent Application Ser. No. 62/586,614 filed Nov. 15, 2017, which is incorporated herein by reference.

BACKGROUND

Built-in-self-test (BIST) is used for circuit testing and integrated or implemented on a chip to reduce complexity in identifying error propagating regions of bits that differ in logic orientation. BIST includes various types, such as automatic test pattern generation (ATPG), programmable BIST (pBIST), self-healing elements, and the like. BIST is applied for on-board diagnostics with high reliability, aviation, integrated circuits, automotive electronics, etc. BIST has also emerged as a promising solution to very large scale integration (VLSI) testing problems. BIST uses a design for testability (DFT) methodology aimed at detecting faulty components in a system by incorporating test logic on chip.

SUMMARY OF THE INVENTION

Disclosed is a device and methods that provide for one or more cores under test, a clock control circuit that is coupled to the cores under tests. The clock control circuit provides a slow-speed operation or alternatively an at speed operation for an enable clock. A built-in-self-test (BIST) controller is coupled to the cores under test. Each core under test includes: one or more memories, a clock gating circuit that selectively enables clocks to drive test sequences to inputs of the memories or to output of the memories, and a mode control circuit that selectively controls a test mode on the inputs of the memories or the outputs of the memories. Selective control of the test mode is implemented during the slow-speed operation or the at-speed operation of the enabled clock.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

In an embodiment, a method of testing a functional memory interface logic at rated speed includes: generating test sequences for a memory by a built-in-self-test (BIST) controller; selectively enabling a clock to drive the test sequences to an input of the memory or an output of the memory; selecting a slow-speed or at-speed operation for the enabled clock; and selecting a test mode on the input of the memory input or the output of the memory. The test mode can include a functional mode or a BIST mode. Functional mode is the device operational mode in which functional logic is exercised. Functional logic that interfaces with memory is referred to as functional memory interface logic. Functional memory interface logic may be exercised during test by entering the functional mode. Similarly, BIST logic that interfaces with memory is referred to as BIST memory interface logic. BIST memory interface logic may be exercised during test by entering the BIST mode. As described herein, the BIST mode can be used for data initialization of the memory, while the functional mode can be used to capture desired memory output during the testing process. Furthermore, the BIST mode can be implemented at slow speed while the functional mode can be implemented at-speed or a rated speed.

Figure 1:
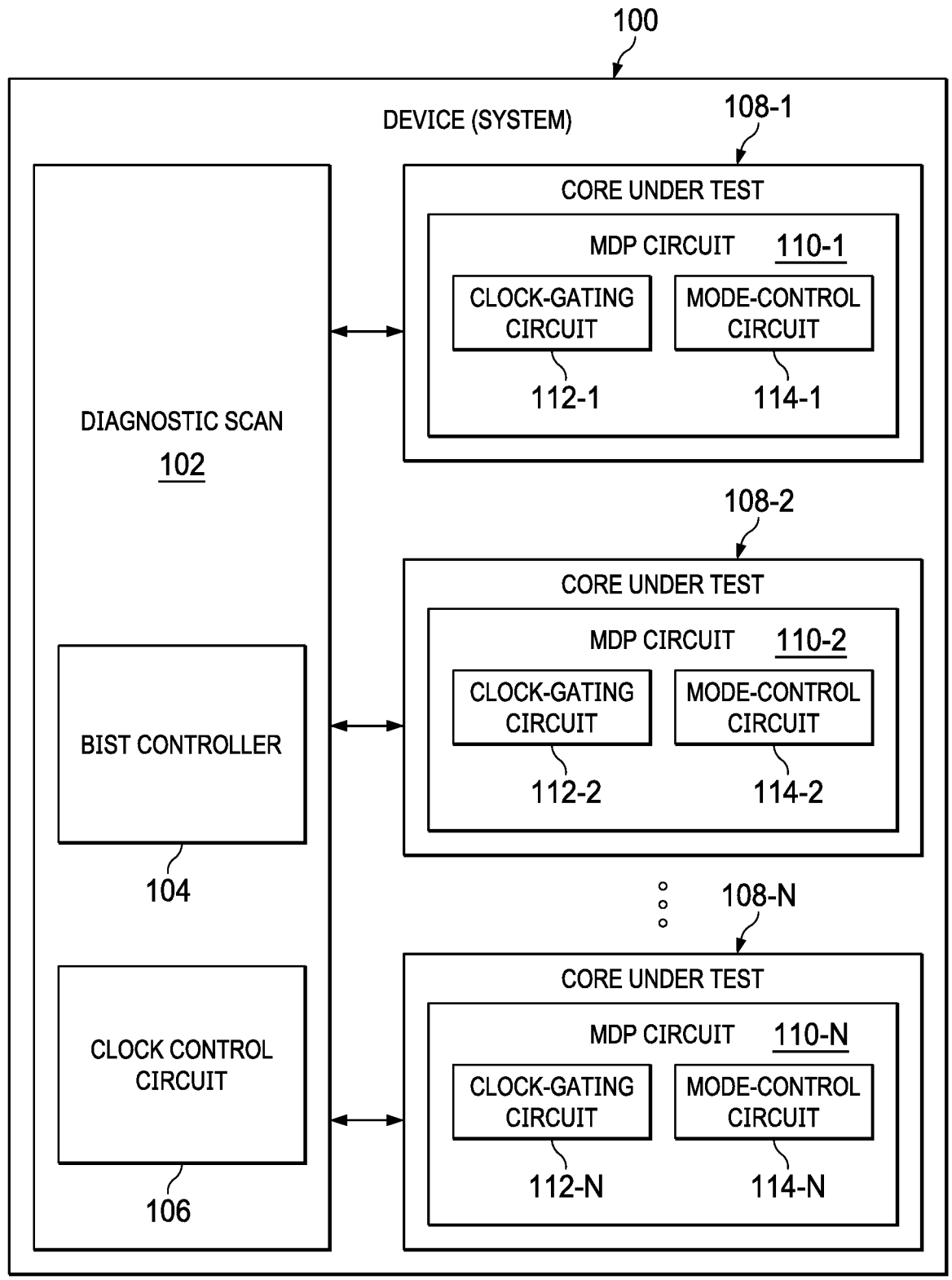
FIG. 1 is a block diagram of a device or system that implements at-speed testing and slow speed testing of functional memory interface logic.

FIG. 1 is an example block diagram of device or system 100. In some embodiments, the device 100 is a system on a chip or system on chip (SoC or SOC), such as very large scale integration chip or VLSI chip. In various implementations, the device 100 includes various processors, memory and inter/intra communication interfaces and paths. In example embodiments, the device 100 is a chip that supports various functions and functionality of a larger system, such as an automobile system and subsystems. For example, device 100 is part of an automobile engine system and accessories, where the system and sub-systems include a memory or a plurality of memories that implement different functionalities of the car engine and its accessories. In examples where device 100 is an SoC, the memories may, in some examples, be embedded memories that are included on the same SoC as the interface paths, BIST logic, functional logic, main CPU, or other circuitry. In further examples, the memories may be on a separate die or chip from one or more of the other components in the SoC.

For example, a memory (not shown) is part of a system that implements functionalities of a windshield wiper. The functionalities include selection of different wiper speeds, manual and automatic wiper speed adjustments, rain sensor to activate or turn ON the windshield wiper, and the like, in response to an input command or a set of input commands.

The diagnostic scan circuit 102 detects or performs testing of functional memory interface logic to assure that the functional memory interface logic is working when supplied with an input command or a set of input commands. Example input commands are represented by test sequences that are generated and supplied by the diagnostic scan circuit 102 to the memory that implements the windshield wiper functionalities.

In some examples, the diagnostic scan circuit 102 is configured to perform the testing of functional memory interface logic on a plurality of memories (not shown) that implement one or multiple functionalities. For example, the plurality of memories includes a first memory that is coupled to a second memory. In this example, the diagnostic scan circuit 102 performs the testing of functional memory interface logic on the first memory, the second memory, or on both memories at the same time. In this example, the diagnostic scan circuit 102 can use a slow speed BIST mode to initialize each memory, and thereafter use an at-speed functional mode to obtain desired testing output. The desired testing output can include the response of the memory when supplied with an input command or set of input commands.

For some embodiments, the diagnostic scan circuit 102 includes a programmable built in self-test controller (BIST) or BIST controller 104. In some examples, the BIST controller 104 is configured to generate and supply test sequences. Also for some embodiments, the diagnostic scan circuit 102 includes a clock control circuit 106. In some examples, the clock control circuit 106 is configured to provide slow-speed or at-speed clock pulses or signals to the memory interface logic and/or memories as appropriate for a test.

For some embodiments, the diagnostic scan circuit 102 communicates with one or more device under test, design under test or core under test circuits 108-1, 108-2 to 108-N. The core under test circuit 108 includes one or more memory data path or MDP circuits 110-1, 110-2 and 110-N. In some examples, the MDP circuits 110-1, 110-2 and 110-N respectively include clock gating circuits 112-1, 112-2 and 112-N and mode control circuits 114-1, 114-2 and 114-N. Furthermore, in some examples, as further discussed below, the core under test circuits 108 include one or more memories for testing. In further examples, one or more of the memories may be on a separate chip or die from some or all of the rest of the core under test 108 circuitry. Clock gating circuit 112 provides separate clock gating of memory input and output BIST logic during at-speed functional mode.

To initialize a memory or plurality of memories on a core under test circuit 108, the clock control circuit 106 is configured to selectively provide a slow-speed operation for an enabled clock for a BIST input interface on the input side of the memory, a BIST output interface on the output side of the memory, and/or for the memory itself. In some examples, the diagnostic scan circuit 102 configures a memory to be in BIST mode and operates core under test 108 in a slow speed mode when initializing the memory during a test sequence. For example, BIST controller 104 logic performs initialization for a test sequence by using one or more slow-speed BIST cycles. In this example, the BIST controller 104 logic and memory is operating at slow speed mode during the initialization process.

Figure 2:
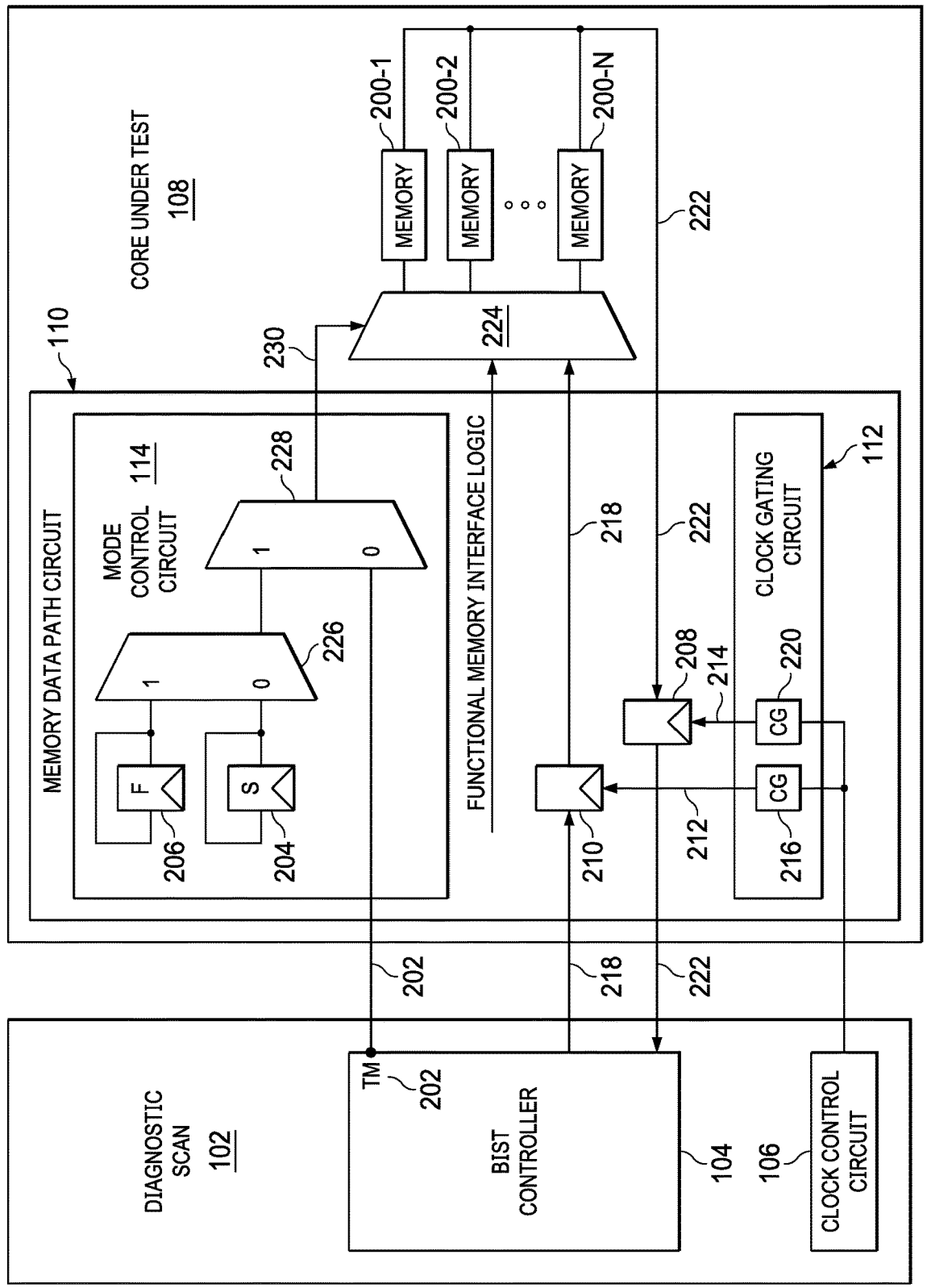
FIG. 2 is a block diagram of test components of a device or system that implements at speed and slow speed testing of multiple memories on the device or system.

FIG. 2 is an example circuit block diagram of test components of device 100 that implements at speed and slow speed testing of multiple memories. The functional memory interface logic is not shown in FIG. 2. In this example, the diagnostic scan circuit 102 communicates with a core under test circuit 108. As discussed above, in some embodiments, the diagnostic scan circuit 102 communicates with multiple core under test circuits 108.

In some embodiments, the core under test circuit 108 includes one or more memories 200-1, 200-2 and 200-N. The memories 200 may be coupled to one another and testing of memories may be performed independent of one another. Functional memory interface logic may include the digital logic that interfaces with the memory to perform write and read operations, to store data into the memory and retrieve data from the memory, respectively, based on the functionality of the device. The functional memory interface logic may perform the functional operation of the device, such as write data into the memory (i.e., memories 200) and read data from the memory (i.e., memories 200). For example, functional memory interface logic of an instruction memory may store instructions into the memory (i.e., memories 200) or perform a write, or retrieve the next instruction from the memory (i.e., memories 200) or perform a read. In some examples, the diagnostic scan circuit 102 performs testing of functional memory interface logic of a core under test circuit 108, and in particular for memories 200. In some embodiments, the BIST controller 104 is configured to generate and supply test sequences to the core under test circuit 108.

In some examples, test sequences include pre-configured data that generates and/or generates a particular output when retrieved from a memory on the core under test circuit 108. The pre-configured data can include input signals that are supplied to functional memory interface logic to generate the particular output. Furthermore, the writing and/or scanning in of the pre-configured data can be at slow speed or at speed, which includes a rated or high speed. Furthermore still, the memories can be configured to operate in a particular test mode such as a functional mode or a BIST mode.

Core under test 108 may also include test collars (or test wrappers) for each of the memories 200. The test collars may be scan test collars, BIST test collars, or combined scan-BIST test collars. A BIST test collar may include a combined scan-BIST test collar. The test collars for each of the memories 200 may include one or more multiplexers for some or all of the inputs and/or outputs. These multiplexers are represented by multiplexer 224 in FIG. 2. The control input for each of these multiplexers may be coupled to the output of mode control circuit 114.

In some examples, a test collar-enabled memory may be formed by an individual memory (e.g., memory 200-1) and its associated test collar. The test collar-enabled memory may include dual inputs where each dual input has a functional mode input and a corresponding test mode input (or BIST mode input). For example, a test collar-enabled memory may include a functional data input and a corresponding test data input (or BIST data input). Similarly, the test collar-enabled memory may include a functional address input and a corresponding test address input (or BIST address input). The test collar-enabled memory may also include a test mode input that is coupled to the output of mode control circuit 114. A test collar-enabled memory may also be simply referred to as a memory in this disclosure.

The test collar for the test collar-enabled memory may include one or more multiplexers (e.g., corresponding to multiplexer 224) where each multiplexer corresponds to one or more of the dual inputs of the memory. For example, the test collar may include a data input multiplexer, an address input multiplexer, a write-enable multiplexer, and a memory-enable multiplexer. Each of the multiplexers may have a functional input and a BIST input, and a select input. The functional input for the multiplexer may be coupled to a corresponding functional input or input port of the test collar-enabled memory. The BIST input or the multiplexer may be coupled to a corresponding BIST input or input port of the test collar-enabled memory. The select input may be coupled to a common test mode input of the test collar-enabled memory.

The test collar-enabled memories may be configurable to operate in a functional mode or a BIST mode based on the signal provided at the test mode input port of the memory. When operating in the functional mode, the test collar-enabled memory may route the corresponding functional input ports to the memory array (e.g., memory 200). For example, the multiplexer may route the data at the functional data input of the memory to the data input of the memory array. When operating in the BIST mode, the test collar-enabled memory may route the corresponding BIST input ports to the memory array (e.g., memory 200). For example, the multiplexer may route the data at the test data input of the memory to the data input of the memory array.

Mode control circuit 114 may operate in two different test control modes. The test control modes may determine how the test mode is generated by mode control circuit 114. The test control mode may be selected by a control or select input of multiplexer 228. In some examples, diagnostic scan circuit 102, BIST controller 104, a host central processing unit (CPU), a memory controller and/or another circuit may control the test control mode for mode control circuit 114 by controlling the select or control input of multiplexer 228.

In a first test control mode, the select input of multiplexer is set to zero. In this mode, BIST controller 104 generates a signal at test mode (TM) output 202 that controls whether the memories (e.g., test collar-enabled memories) operate in a functional mode or a BIST mode, and multiplexer 228 routes the TM output 202 of BIST controller 104 directly to the test mode inputs of the memories (e.g., the control input of multiplexer 224). BIST controller 104 may set TM output 202 to "0" for functional mode, and set TM output 202 to "1" for BIST mode.

In a second test control mode, flip-flops 204, 206, and multiplexer 226 generate a test mode signal to control the test mode for memories 200 (e.g., whether memories operate in a functional mode or a BIST mode), and multiplexer 228 routes the signal generated by multiplexer 226 to the test mode inputs of the memories (e.g., the control input of multiplexer 224). Multiplexer 226 may have a control or select input that receives a signal indicative of whether clock control circuit 106 and/or device 100 is operating in a slow clocking mode or a fast or at-speed clocking mode. For example, flip-flop 204 may control the test mode (e.g., functional or BIST) for memories 202 when device 100 is operating in a slow clocking mode, and flip-flop 206 may control the test mode for memories 202 when device 100 is operating in a fast or at-speed clocking mode. The second test control mode may be used to control the memory test mode used during initialization of the memories 200 for a test sequence. By controlling the memory test mode (e.g., functional mode and BIST mode) with slow register 204 and fast/at-speed control register 206 instead of being driven by BIST controller TM output 202 during memory initialization, a simpler BIST path can be run at slow speed, while having the ability to test functional path delay defects at speed. The memory data path circuit 110 together with the BIST controller 104 is collectively referred to as BIST logic.

For some examples, slow speed processing of the pre-configured data is implemented during an initialization of the core under test circuit 108 using BIST mode. For other implementations, processing or an execution of memory output logic 208 and/or memory input logic 210 on the initialized core under test circuit 108 is implemented using at-speed functional mode.

In some examples, test sequences include input data that generate a particular scan output when captured at-speed in a functional test mode. In this example, and in case of plurality of memories 200 of core under test circuit 108, the BIST controller 104 supplies input data independently to each memory of the plurality of memories 200 of the core under test circuit 108. In other words, the input data is selectively supplied to the memory input interface logic and/or supplied to configure the memory output interface logic to capture the outputs of each memory 200 of the core under test circuit 108.

Furthermore, each memory 200 on the core under test circuit 108 is independently initialized using the slow speed BIST mode as described herein. Furthermore in this example, the clock gating circuit 112 provides clock signal 212 and clock signal 214. Clock signal 212 is provided through clock gate instance 216 to register 210 at the input side of memories 200. Clock signal 214 is provided through clock gate instance 220 to register 208 at the output side of memories 200. Clock gating circuit 112 selectively enables the clock signals 212 and 214 to drive the test sequences to the memory input and/or memory output sides on the core under test circuit 108. The clock gate instance 216 selectively enables or shuts off clock signals to register 210 and/or other components of memory input interface logic 218. Similarly, the clock gate instance 220 selectively enables or shuts off clocks to register 208 and/or other components of memory output interface logic 222. Clock gate instances 216 and 220 control the corresponding memory input interface logic 218 from the BIST controller 104 and the memory output interface logic 222 to the BIST controller 104.

For example, in case of plurality of memories 200 on the core under test circuit 108, the clock gating circuit 112 is configured to selectively enable a clock coupled to the memory input and/or the memory output of memories 200 of the core under test circuit 108. This selective enabling facilitates the driving of the test sequences from the BIST controller 104 to the memory input interface logic 218 or capturing the memory output interface logic 222 of each memory of the plurality of memories 200 on the core under test circuit 108. In this example, the selective enabling of the clock at the memory input or memory output of a particular memory 200 is independent from the enabling of the clock at the memory input or memory output of another memory 200 on the core under test 108.

Figure 3:
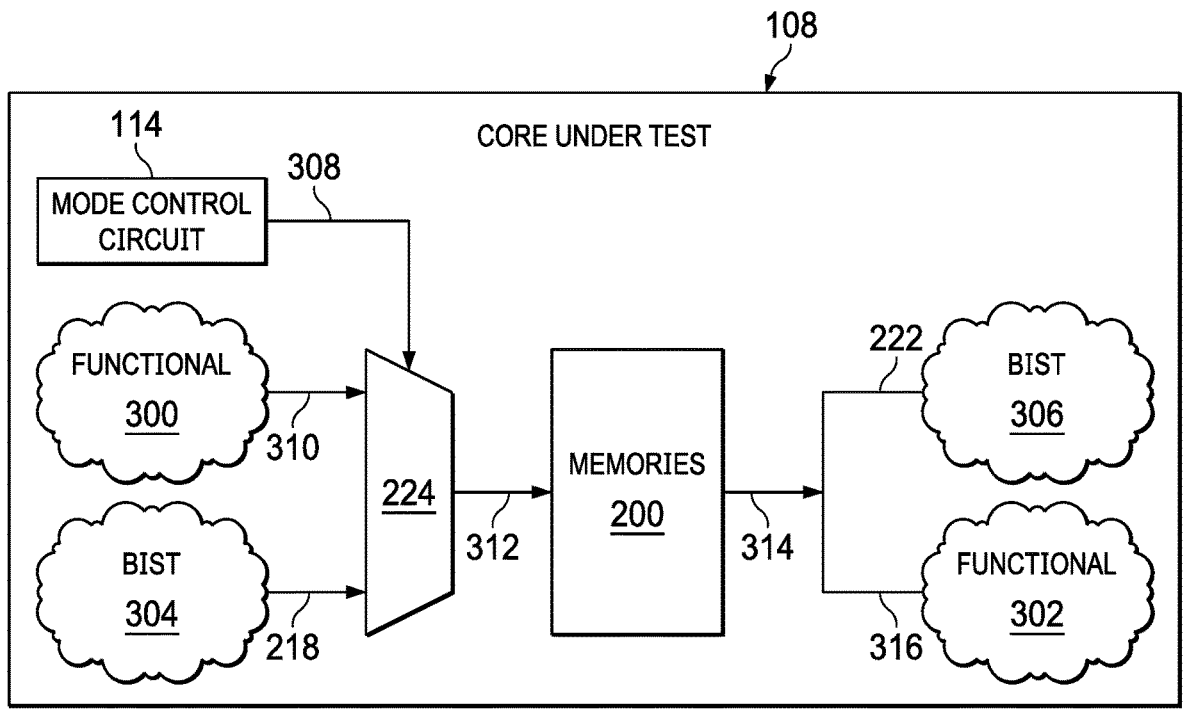
FIG. 3 is a block diagram that illustrates functional memory interface logic and built-in-self-test (BIST) logic.

To initialize the memory or plurality of memories on the core under test 108, the mode control circuit 114 is configured to choose BIST mode in the multiplexer 224 and the clock control circuit 106 is configured to provide a slow-speed clock for registers 208, 210, memory input interface logic 210, memory output interface logic 208, and/or memories 200. For example, the diagnostic scan circuit 102 may configure the memories or multiplexer 224 to operate in the BIST mode when initializing the memories 200 on the core under test 108 at the slow-speed operation. For example, BIST controller logic, clock control circuit 106 and/or diagnostic scan circuit 102 may initialize the functional memory interface logic, the BIST interface logic and/or the memories using one or more slow-speed scan cycles. It is noted that BIST input 218 of multiplexer 224 is shown in FIG. 2, and that the functional input of multiplexer 224 is shown in FIG. 3 as 310. The select inputs of multiplexers 226 and 228 are driven by diagnostic scan circuitry.

As described herein, functional mode includes connecting elements on the core under test according to a desired topology or design. This desired topology or design corresponds to a desired utility or function for which the core under test is primarily designed. On the other hand, the BIST mode is a test mode that is sourced from a logic independent of the functional memory interface logic. As described herein, the BIST mode may be used during the initialization of the core under test circuit 108 at a particular speed such as the slow speed. The particular speed, for example, is facilitated by the clock control circuit 106.

The mode control circuit 114 is configured to choose BIST mode in the multiplexer 224 to selectively control the test mode of the memories. For example, the mode control circuit 114 may toggle between slow speed register 204 and at-speed register 206 when testing functional memory interface logic at rated speed to obtain high test quality. Furthermore, the mode control circuit 114 may use selective control of the test mode by ensuring that the test mode does not switch from the functional mode to the BIST mode, and vice-versa, during the functional memory interface logic testing e.g., scan capture. In some examples, the mode control circuit 114 includes hold flip-flops 204 and 206 that hold data by a loop back from output to input of hold flip-flops 204 and 206 to prevent switching between functional mode and BIST mode during an at-speed scan capture. It is noted that the hold flip-flops 204 and 206 may be initialized to the desired value by the diagnostic scan circuitry 102 and do not change value during the capture cycles. Hold flip-flops 204 and 206 are connected to multiplexers 226 and 228. Selection of multiplexer 228 is set to "1" to use the output of multiplexer 226 to set the memory in functional or test mode as appropriate. Select of multiplexer 228 is set to 0 for modes where the control is driven through BIST controller output 202. In the functional mode, the BIST controller output 202 is set to 0 to select functional interface of multiplexer 224. The select input of multiplexer 224 is represented by line 230. The BIST mode uses the BIST controller 104 to test memories by setting the output 202 to 1. Multiplexer 226 may allow the test mode to be independently controlled based on whether device is operating at a slow or fast speed. Diagnostic scan circuit 102 and/or clock control circuit 106 may set the select input of multiplexer 226 to "0" during slow-speed capture cycles to set the memories 200 in test or functional mode based on the value of the hold flip-flop 204. Diagnostic scan circuit 102 and/or clock control circuit 106 may set the select input of multiplexer 220 to "1" during at-speed capture cycles to set the memories 200 in test or functional mode based on the value of the hold flip-flop 206. The hold flop-flops 204 and 206 get clocks from clock control circuit 106. The hold flip-flops 204 and 206 are initialized based on scan shift to either use functional logic or BIST logic during the corresponding slow-speed or at-speed capture cycles.

In some examples, flip-flops may be scan flip flops that include a data input, a scan input, a scan enable input, a clock input, and a data output. The data output may be coupled to the data input. The scan input and the scan enable input may be coupled to and controlled by diagnostic scan circuit 102. Diagnostic scan circuit 102 may independently control the test mode (e.g., functional or BIST) used by memories during slow and at-speed testing by scanning in appropriate bits to the scan flip-flops 204, 206.

In some examples, after the initialization of the core under test circuit 108 at slow speed using either BIST mode or functional mode, the mode control circuit 114 selects the functional mode to execute at-speed test of the functional memory output interface logic 302, shown in FIG. 3. In this example, the clock control circuit 106 produces an at-speed clock for the functional memory interface logic, the BIST interface logic, and the memory, and causes clock gating circuit 112 to disable the clock for controlling registers 208 and/or 210. The clock gate instance 220 of the clock gating circuit 112 disables the enabled clock for the memory output interface BIST logic when in functional mode to avoid coverage credit for the memory output path 314 through the BIST logic 306 during the testing process.

Thereafter, the mode control circuit 114 facilitates a switching back to either BIST mode or functional mode on the multiplexer 224 at the end of two or more at-speed scan capture cycles. For example, the BIST mode includes the slow-speed operation of the enabled clock to obtain logic results for two or more at-speed capture cycles through the BIST logic. The functional mode includes the slow-speed operation of the enable clocks to obtain logic results for two or more at-speed capture cycles through the functional memory interface logic.

Similarly, when executing memory input interface logic, the mode control circuit 114 selects the functional mode on multiplexer 224 after the initialization of the core under test circuit 108 at slow speed. The initialization may be performed either using BIST mode or using functional mode with slow speed capture cycles. In this case, the clock control circuit 106 generates an at-speed clock for the functional memory interface logic, the BIST interface logic, and the memory, and causes clock gating circuit 112 to disable the clock for controlling registers 208 and/or 210. The clock gate instance 216 further disables the enabled clock for the memory input BIST logic when in functional mode to avoid coverage credit from the BIST logic.

Furthermore, the mode control circuit 114 facilitates switching back to the BIST mode at an end of two or more at-speed scan capture cycles. For example, the BIST mode includes the slow-speed operation of the enabled clock to obtain logic results for two or more at-speed capture cycles.

With the above selective use of memory data path to test functional memory interface logic using at-speed functional mode, a higher test quality is obtained. Furthermore, the test quality is obtained with negligible increase in chip real estate and marginal test time increase.

As discussed, core under test circuit 108 can include one or more memories 200. In some examples, the memories 200 are coupled to one another. Regardless of whether the memories 200 are coupled to one another or not, the memories 200 may, in some examples, be independent of one another. In other words, the memories 200 are tested independent of one another. Furthermore, when initializing the memories 200, memory pointer addresses are implemented such that data used for the initialization is loaded in parallel to access all addresses in each memory 200.

In some examples, to test the functional memory interface logic of the core under test circuit 108, the BIST controller 104 generates and selectively supplies the test sequences to an input side or output side of the first memory 200-1, or to an input or output side of the second memory 200-2. For example, the clock gating circuit 112 facilitates the selective enabling of the clock that is coupled to the input side of the first memory 200-1 to supply the test sequences from the BIST controller 104. In this example, the test sequences are supplied independently to the first memory 200-1. In other words, the test sequences are applied to an enabled clock coupled to the input of the second memory 200-2.

In the example above, the clock control circuit 106 selectively controls the speed of the enabled clock at the input side of the first memory 200-1. For example, the data initialization of the first memory 200-1 is implemented at slow speed. In this example, the clock control circuit 106 selectively controls the speed of the enabled clock at the input side of the first memory 200-1 to be at slow speed. After this initialization, the mode control circuit 114 facilitates test mode selection to functional mode in order to execute the memory input BIST logic. This execution of the memory input BIST logic is performed on two or more at-speed operation for the enabled clock. The at-speed functional mode to generate the output is implemented regardless of how the input is written.

FIG. 3 shows the functional memory interface logic and BIST memory interface logic. The functional memory interface logic is used during functional mode and the BIST memory interface logic is used during BIST mode. Functional memory interface logic 300 and 302 performs the functional operation of the device 100. For example, functional memory interface logic 300 may be used to write data to memories 200 and functional memory interface logic 302 may be used to read data to memories 200 in functional mode. Similarly, BIST memory interface logic 304 and 306 are used by BIST controller 104 and memory data path circuit 110 to write data to memory and read data from memory in BIST mode.

For some examples, the mode control circuit 114 provides an input 308 to multiplexer 224 to choose between functional mode and BIST mode. If functional mode is chosen, then functional memory input interface logic 300 through the functional memory input interface path 310 controls the memories 200. If BIST mode is chosen, then BIST input interface logic 304 through the BIST path 218 controls the memories 200. The path 312 represents the memories 200 input controls that are driven either by functional memory interface path 310 or BIST path 218, depending on which mode is chosen. Similarly, the memory output path 314 drives functional output interface logic 302 through the continuing functional memory interface path 316 and BIST output interface logic 306 through the continuing BIST path 222.

Figure 4:
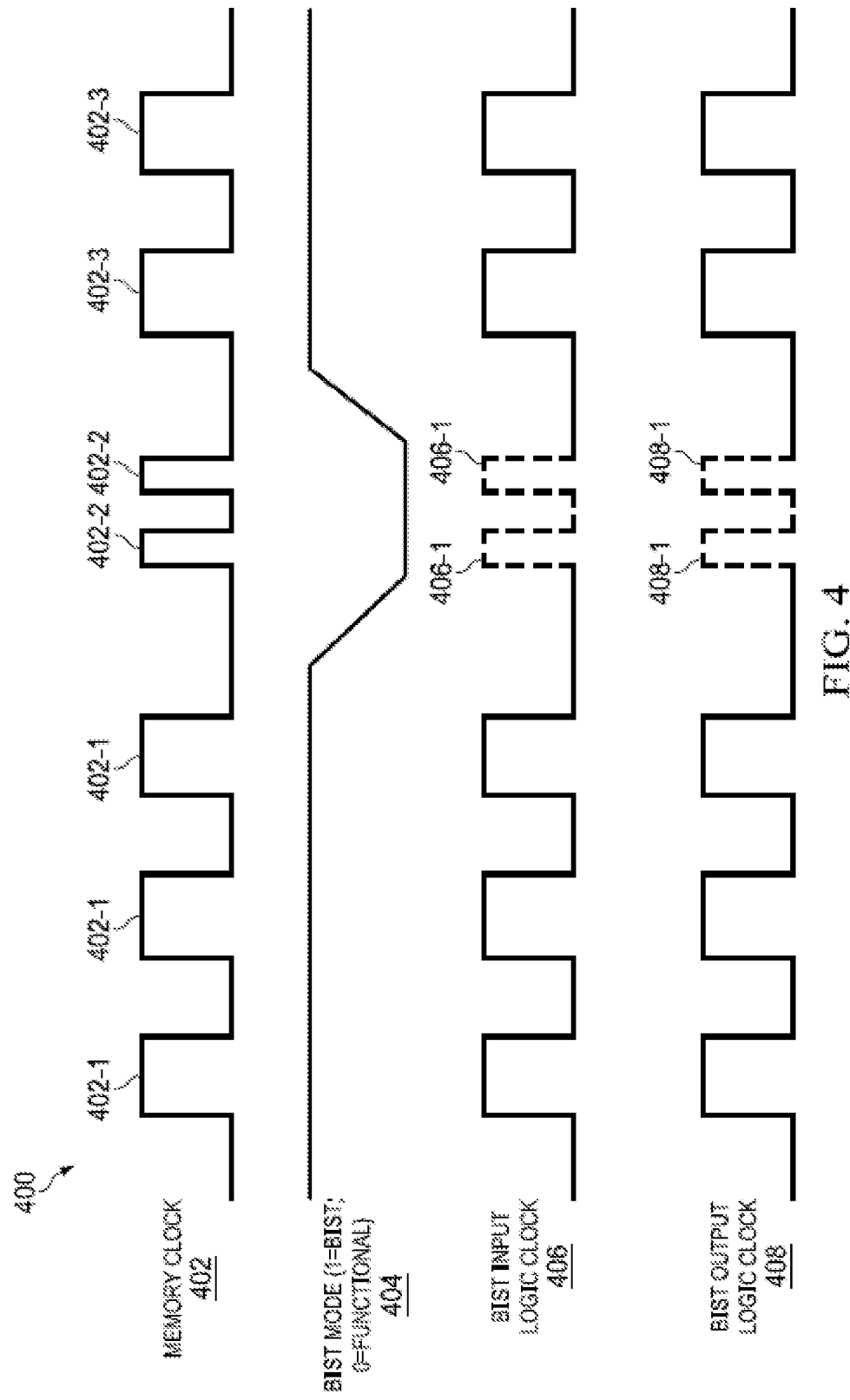
FIG. 4 is a clocking sequence of selective enabling of clocks coupled to a memory input interface and a memory output interface built-in-self-test (BIST) logic.

FIG. 4 shows an embodiment of an example clocking sequence 400 that shows selective enabling of clocks coupled to a memory input interface and a memory output interface BIST logic.

For example, a waveform 402 represents an example clock that includes a combination of slow-speed clock signals 402-1 and 402-3, and at-speed clock signals 402-2. Below the waveform 402 is a waveform 404 that indicates the mode control (selected by output of mode control circuit 114 through the multiplexers 226 and 228 that drives the select of multiplexer 224) where a high-state (i.e., "1") indicates BIST mode and low-state (i.e., "0") indicates the functional mode for the memory test. It may be noted that hold flip-flop 204 drives the BIST mode for slow-speed clock pulses and is set to 1 in this example as BIST mode 404 is 1 during slow speed cycles of 402-1 and 402-3. Further, the hold flip-flop 206 drives the BIST mode for at-speed clock pulses and is set to 0 in this example as BIST mode 404 is 0 during at-speed cycles 402-2.

FIG. 4 further shows a waveform 406 that indicates the clock at the memory input BIST logic where clock signals 406-1 are selectively disabled using the clock gating circuit 112 at the memory input. Similarly, for memory output BIST logic, a waveform 408 indicates the clock at the memory output BIST logic where the clock signals 408-1 are selectively disabled using the clock gating circuit 112 at the memory output. In this example, the slow-speed clock signals 402-1 and 402-3 initialize the memory using BIST mode.

As described herein, the two at-speed clock signals 406-1 or 408-1 are used to test the functional input or functional output memory interface logic. On the other hand, the slow-speed waveforms 402-1 or 402-3 propagate the memory input or output using the BIST mode to launch or capture the test results.

The order and combination of signal states illustrated in the waveforms of FIG. 4 is intended to provide an example embodiment and not to be construed as a limitation of the implementations described herein. For example, any other combination of slow-speed and at-speed clocks, BIST mode and functional modes, and/or enabling and disabling of clocks as applicable is supported by the embodiments described above.

Figure 5:
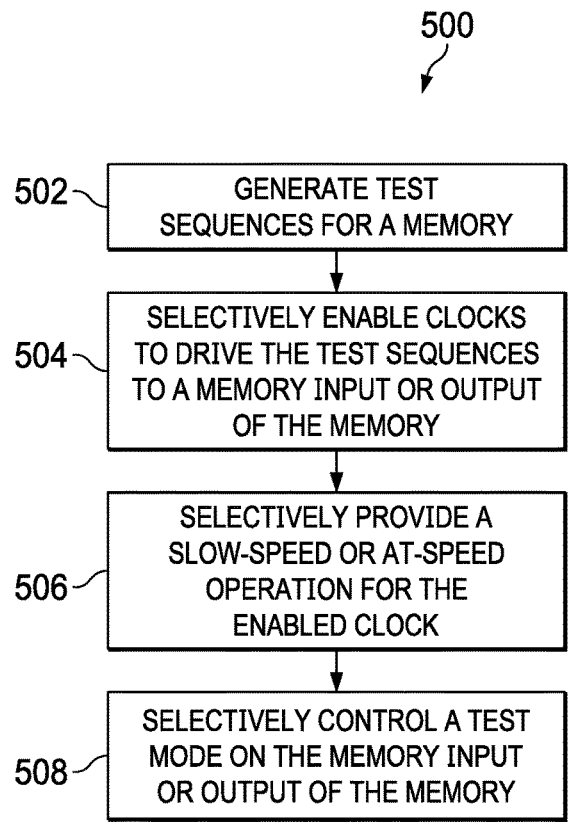
FIG. 5 is a process chart illustrating an example method for selectively using a memory data path to test functional memory interface logic at rated speed to achieve high test quality.

FIG. 5 shows an example process chart 500 illustrating an example method for selectively using memory data path to test functional memory interface logic at rated speed to achieve a high test quality as described herein. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 502, test sequences for memory by a built-in-self-test (BIST) controller are generated. For example, the BIST controller 104 generates the test sequences to the memories 200 of the cores under test 108.

At block 504, enable clocks to drive the test sequences to a memory input or output of the memory are selected. For example, the clock gating circuit 112 selectively enables the clocks at input or output sides of the memories 200 of cores under test 108.

At block 506, clock control circuit 106 selectively provide a slow-speed or at-speed operation for the enabled clock. For example, the clock control circuit 106 selectively provides the slow-speed or at-speed operation for the enabled clock. During data initialization cycles, the clock control circuit 106 facilitates the slow speed operation while during the at-speed test cycles, the clock control circuit 106 facilitates at-speed operation. In some examples, the data initialization cycles and at-speed test cycles may be repeated one after another.

At block 508, the selective control of the test mode, to either use functional mode or BIST mode, is implemented during the corresponding slow-speed or at-speed operation for the enabled clock. For example, the mode control circuit 114 may selectively use BIST mode during the initialization cycles to write memory using the BIST memory interface logic and switch to functional mode during the at-speed test cycles to perform write and/or read using the functional memory interface logic.

In some examples, diagnostic scan circuit 102, a memory controller, a host processor, or another circuit may perform one or more test sequences using all or a part of core under test 108. In some cases, a test sequence may include an initialization phase followed by a scan capture phase followed by a propagation phase. In some examples, the initialization phase my include writing data to memory and/or scanning in data to one or more scan flip-flops located in the functional memory interface logic (e.g., functional input logic 300 or functional output logic 302), the BIST memory interface logic (e.g., BIST input logic 304 or BIST output logic 306), or the memory itself (e.g., flip-flops in the test collar (e.g., the scan collar)). The scan capture phase may involve performing memory reads and writes via the functional memory interface for at least two clock cycles using the at-speed clock cycle. The scan capture phase may include the writes and/or reads that cause the fault transition to occur that corresponds to the tested fault. The propagation phase may involve scanning out data from the scan-flops to determine the results of the test.

In some cases, the scan capture phase may include only those clock cycles associated with the transition that corresponds to the fault to be tested. In other words, the scan capture phase may include, in some examples, only the clock cycle immediately before and the clock cycle immediately after the transition that corresponds to the fault to be tested.

In some examples, device 100 may use the BIST mode (or BIST path) for the initialization and propagation phases of the test sequence, and use the functional mode (or functional path) for the scan capture phase of the test sequence. In further examples, device 100 may use a slow speed cocking mode for the initialization and propagation phases of the test sequence, and use an at-speed clocking mode for the scan capture phase. In additional examples, device 100 may use a slow speed cocking mode and the BIST test mode for the initialization and propagation phases of the test sequence, and use an at-speed clocking mode and functional test mode for the scan capture phase.

In some examples, a mode control circuit 114 is provided. The mode control circuit 114 includes a test mode input, a test control mode input, a clocking mode input (or clocking speed input), a test mode output, two multiplexers 226, 228, and two scan-hold flip-flops 204, 206. The scan-hold flip-flops 204, 206 may be scan flip-flops with the data output of each flip-flop coupled to the corresponding data input of the respective flip-flop.

A first input of multiplexer 228 is coupled to the test mode input, which is in turn coupled to a test mode output 202 of BIST controller 104. A second input of multiplexer 228 is coupled to the output of multiplexer 226. A select input of multiplexer 228 is coupled to the test control mode input, which may be coupled to and controlled by diagnostic scan circuit 102 or other circuitry.

A first input of multiplexer 226 is coupled to an output of scan-hold flip-flop 204. A second input of multiplexer 226 is coupled to an output of scan-hold flip-flop 206. A control input of multiplexer 226 is coupled to the clocking mode input, which may be controlled by and/or coupled to clock control circuit 106. The scan inputs of flip-flops 204, 206 may be coupled to and controlled by diagnostic scan circuit 102 or other circuitry.

The output of multiplexer 228 is coupled to the test mode output of mode control circuit 114, which in turn may be coupled to the control input of multiplexer 224 and/or the test mode inputs of individual ones of memories 200.

In some examples, a clock gating circuit is provided. The clock gating circuit may include a first input coupled to a clock source (e.g., clock control circuit 106), a first output coupled to the clock inputs of one or more flip-flops or registers 210 on the BIST input interface, and a second output coupled to the clock inputs of one or more flip-flops or registers 208 on the BIST output interface. In some examples, the clock gating circuit 112 may selectively disable the clocks to the flip-flops or registers 208, 210 in one or both of the BIST input and output logic during the scan capture phase when device is operating at-speed in the functional test mode.

A functional memory interface input path (or functional path) may correspond to a path coupled to a functional input port of a dual port memory (e.g., a test-collar enabled memory). A BIST memory interface path (or BIST path) may correspond to a path coupled to a BIST input port of a dual port memory (e.g., a test-collar enabled memory).

What is claimed is:

1. A device comprising:
   one or more cores under test;
   a clock control circuit coupled to the cores under test, that selectively provides a slow-speed operation or an at-speed operation for an enabled clock; and
   a built-in-self-test (BIST) controller coupled to the cores under test;
   wherein each core under test includes:
      one or more memories;
      functional memory interface logic;
      a clock gating circuit that selectively enables clocks to drive test sequences to inputs of the memories or to capture the output of the memories; and
      a mode control circuit responsive to a test control mode signal, wherein the mode control circuit is configured to:
         in response to the test control mode signal indicating a first mode, couple a test mode input of the one or more memories to a test mode select output of the BIST controller, wherein the BIST controller selectively operates the one or more memories in a functional mode or in a test mode; and
         in response to the test control mode signal indicating a second mode, couple the test mode input of the one or more memories to the mode control circuit, wherein the mode control circuit selectively operates the one or more memories in a test mode or in a functional mode responsive to a clock speed signal indicating whether the clock control circuit is providing the slow-speed operation or the at-speed operation of the enabled clock.

2. The device of claim 1, wherein the one or more memories comprise a plurality of memories coupled to one another, and testing of each of the plurality of memories is performed independently of others of the plurality of memories.

3. The device of claim 1, wherein the mode control circuit comprises:
   first and second hold flip-flops, each coupled to the BIST controller for initialization of a state corresponding to the test mode or the functional mode; and
   a first multiplexer for selecting between outputs of the first and second hold flip-flops for selection of one of the test and functional modes, the first multiplexer selecting the output of the first hold flip-flop in slow-speed operation and selecting the output of the second hold flip-flop in at-speed operation.

4. The device of claim 3, wherein the mode control circuit further comprises:
   a second multiplexer for selecting between the outputs of the first multiplexer and the test mode select output of the BIST controller for control of selection of the test and functional modes;
   wherein the second multiplexer selects the output of the first multiplexer, the first multiplexer selects the output of the first hold flip-flop, and the first hold flip-flop stores a state corresponding to test mode, for initialization of the memories using a BIST controller logic for one or more cycles of slow-speed operation of the enabled clock.

5. The device of claim 4, wherein each core under test further comprises:
   memory output interface logic associated with the one or more memories;
   and wherein the first multiplexer selects the output of the second hold flip-flop and the second hold flip-flop stores a state corresponding to the functional mode in which the memory output interface logic to performs a functional operation of the device, comprising reading data from its associated memory using at-speed operation for the enabled clock.

6. The device of claim 5, wherein each core under test further comprises:
- memory output interface BIST logic associated with the one or more memories;
- wherein, in the functional mode, the clock gating circuit disables the enabled clock to from the memory output interface BIST logic and enables the memory output interface logic for two or more cycles of at-speed operation of the enabled clock.

7. The device of claim 3, wherein the mode control circuit further comprises:
- a second multiplexer for selecting between the outputs of the first multiplexer and the test mode select output of the BIST controller for control of selection of the test and functional modes;
- the second multiplexer selects the output of the first multiplexer, the first multiplexer selects the output of the first hold flip-flop, and the first hold flip-flop stores a state corresponding to functional mode for initialization of the memories using the functional memory interface logic for one or more cycles of slow-speed operation of the enabled clock.

8. The device of claim 1, wherein the mode control circuit switches to the functional mode and at-speed operation of the enabled clock to execute memory input interface logic, wherein the mode control circuit provides switching back to the test mode at an end of two or more at-speed scan capture cycles, wherein the test mode includes the slow-speed operation of the enabled clock in order to obtain logic results for two or more at-speed capture cycles.

9. The device of claim 1, wherein the device is a system on a chip (SOC).

* * * * *